(12) United States Patent
Naffziger

(10) Patent No.: US 7,772,906 B2
(45) Date of Patent: Aug. 10, 2010

(54) LOW POWER FLIP FLOP THROUGH PARTIALLY GATED SLAVE CLOCK

(75) Inventor: Samuel D. Naffziger, Fort Collins, CO (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 111 days.

(21) Appl. No.: 12/100,040

(22) Filed: Apr. 9, 2008

(65) Prior Publication Data
US 2009/0256609 A1    Oct. 15, 2009

(51) Int. Cl.
H03K 3/356    (2006.01)
(52) U.S. Cl. ........................................ 327/203; 327/202
(58) Field of Classification Search ................. None
See application file for complete search history.

(56) References Cited

U.S. PATENT DOCUMENTS

| | | | | |
|---|---|---|---|---|
| 5,498,988 | A * | 3/1996 | Reyes et al. ................. | 327/199 |
| 5,712,826 | A | 1/1998 | Wong et al. | |
| 5,764,089 | A | 6/1998 | Partovi et al. | |
| 5,917,355 | A | 6/1999 | Klass | |
| 6,204,707 | B1 * | 3/2001 | Hamada et al. ............. | 327/202 |
| 6,278,308 | B1 | 8/2001 | Partovi et al. | |
| 6,597,620 | B1 | 7/2003 | McMinn | |
| 6,630,853 | B1 * | 10/2003 | Hamada ...................... | 327/202 |
| 6,661,270 | B2 * | 12/2003 | Nagata ........................ | 327/202 |
| 6,753,714 | B2 * | 6/2004 | Gupta ......................... | 327/202 |
| 6,856,270 | B1 * | 2/2005 | Farmer et al. ............... | 341/161 |
| 6,909,314 | B2 * | 6/2005 | Ahn ............................ | 327/202 |
| 6,989,695 | B2 * | 1/2006 | Dike et al. ................... | 327/142 |
| 7,301,373 | B1 | 11/2007 | Bailey et al. | |
| 7,411,413 | B2 * | 8/2008 | Shimazaki et al. ............ | 326/16 |
| 7,420,391 | B2 * | 9/2008 | Pesci ............................ | 326/46 |
| 7,508,902 | B2 * | 3/2009 | Tsai et al. ...................... | 377/64 |
| 2006/0095819 | A1 * | 5/2006 | Bhatia ......................... | 714/726 |
| 2007/0146033 | A1 * | 6/2007 | Pesci ............................ | 327/218 |
| 2008/0218234 | A1 * | 9/2008 | Jain ............................. | 327/202 |
| 2009/0249149 | A1 * | 10/2009 | Naffziger .................... | 714/747 |
| 2009/0256593 | A1 * | 10/2009 | Naffziger .................... | 326/96 |

OTHER PUBLICATIONS

Karnik, et al "Scaling trends of Cosmic Rays induced Soft Errors in static latches beyond 0.18 pts" 2001 Symposium on VLSI Circuits of Technical Papers, pp. 61-62.

(Continued)

*Primary Examiner*—Lincoln Donovan
*Assistant Examiner*—Thomas J Hiltunen
(74) *Attorney, Agent, or Firm*—Rory D. Rankin; Meyertons Hood Kivlin Kowert & Goetzel, P.C.

(57) ABSTRACT

A system and method for reducing power consumption within a flip-flop circuit on a semiconductor chip. A gated input clock signal is received by a slave latch. The gated input clock is derived from an ungated input clock signal and a clock gating condition. The clock gating condition determines when an input data signal of the flip-flop and the stored internal state of the slave latch have the same logic value, such as only a logic low value. If they have the same value, toggling of the ungated input clock signal is not received by the slave latch, signal switching of internal nodes of the slave latch is reduced, and power consumption is reduced.

20 Claims, 11 Drawing Sheets

OTHER PUBLICATIONS

Goel, et al "Low-Overhead Design of Soft-Error-Tolerant Scan Flip-Flops with Enhanced-Scan Capability" 2006 Asia and South Pacific Conference on Design Automation, Jan. 24-27, 2006 pp. 665-670.

Krishnamohan, et al "A Highly-Efficient Techniques for Reducing Soft Errors in Static CMOS Circuits" pp. 126-131, 2004 IEEE International Conference on Computer Design (ICCD'04), 2004.

* cited by examiner

LOW POWER FLIP FLOP THROUGH PARTIALLY GATED SLAVE CLOCK

BACKGROUND OF THE INVENTION

1. Field of the Invention

This invention relates to electronic circuits, and more particularly, to reducing power consumption within a flip-flop circuit on a semiconductor chip.

2. Description of the Relevant Art

The power consumption of modern complementary metal oxide semiconductor (CMOS) chips is proportional to the expression $\alpha fCV^2$, where the symbol $\alpha$ is the switching factor, or the probability a node will charge up or discharge during a clock cycle; f is the operations frequency of the chip; C is the equivalent load capacitance to be charged or discharged in a clock cycle; and the symbol V is the operational voltage of the chip. In order to reduce power consumption, one or more of these parameters may need to be reduced. However, reducing the operational frequency, f, also reduces the performance of the circuits on the chip. Therefore, this reduction is generally not desirable. Reducing the operational voltage, V, reduces the amount of current that may flow through a transistor and, thus, increases the propagation delays through transistors. If the threshold voltages are reduced in order to turn-on the transistors sooner and aid in maintaining performance, then transistor current leakage increases, which increases power consumption.

The last two terms $\alpha$ and C may be reduced by disabling portions of the chip during periods of non-use or by reducing transistor sizes. Also, some circuits that are used across the chip, rather than only in certain portions or blocks of the chip, may be investigated for power reduction techniques. One such circuit is the flip-flop circuit used for retaining state. The number of flip-flop circuits, which has reached the hundreds of thousands in modern designs, has been increasing with each generation of processors. The internal nodes of these circuits switch every clock cycle and, therefore, contribute to the total power consumption of the chip. One method of reducing the power consumption of flip-flop circuits is reducing the transistor sizes. However, a limit is reached when the transistors already have the minimum available channel width.

Another method to reduce the power consumption of flip-flop circuits is to use conditional techniques. These techniques disable the clock to the flip-flop circuits when the state of the flip-flop does not need to change. If the data input that meets the setup time to a flip-flop is the same as the already stored value within the flip-flop, then the output of the flip-flop is not going to change and the internal nodes do not need to switch during the subsequent clock cycle.

These conditional techniques allow the power consumption of flip-flop circuits to be reduced, but they may also require an exclusive or (XOR) type computation in order to verify the data input and the retained state have the same value. This added circuitry significantly increases the area of the flip-flop circuits and increases the number of gate delays for the data input to traverse within the flip-flop prior to the arrival of the clock edge.

In view of the above, efficient methods and mechanisms for reducing the power consumption of flip-flop circuits with a minimal additonal area and time delay are desired.

SUMMARY OF THE INVENTION

Systems and methods for reducing power consumption within a flip-flop circuit on a semiconductor chip are disclosed.

In one embodiment, a semiconductor chip may comprise flip-flop circuits with a gated input clock signal received by a slave latch of a flip-flop. The gated input clock signal may be dependent upon an ungated input clock signal and a clock gating condition. The clock gating condition may be performed by a gate with transistors which are independent of the transistors in a master and a slave latch of the flip-flop. A prebuffered data output of the slave latch may be the node prior to the output driver inverter. The clock gating condition performed by the gate may include determining when both the input data signal and the prebuffered data output have a same value. By taking advantage of the change in state of flip-flops and the probability that a flip-flop stores a particular value (e.g., a logic low value) on its prebuffered data output node, this conditional clock gating may reduce power consumption by reducing the size of the slave latch, reducing clock loading of the flip-flop, and reducing transitions of internal nodes of the flip-flop.

In another aspect of the invention, a method is provided to conditionally gate the clock received by a slave latch of a flip-flop. A gated input clock signal is received by a slave latch. The gated input clock is derived from an ungated input clock signal and a clock gating condition. The clock gating condition determines if an input data signal of the flip-flop and the stored internal state of the slave latch have the same logic low value. If so, toggling of the ungated input clock signal is not received by the slave latch. In this manner, signal switching of internal nodes of the slave latch are reduced and power consumption may be reduced.

These and other embodiments will be appreciated upon reference to the following description and accompanying figures.

Figure 1:
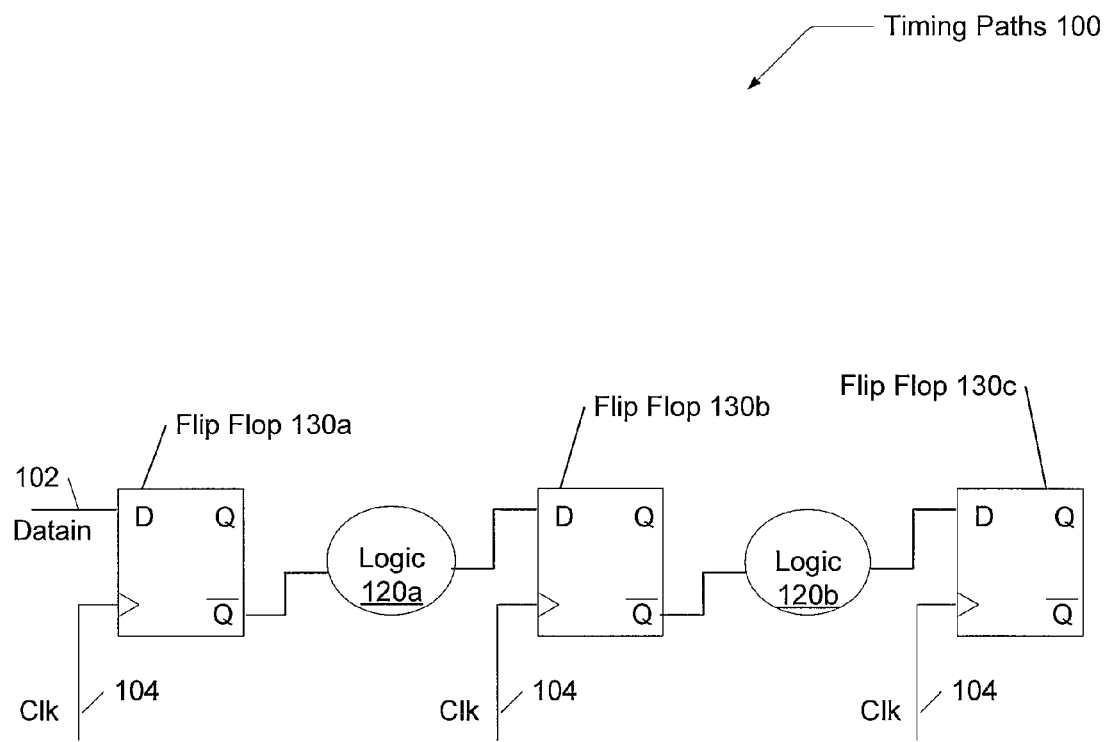
FIG. 1 is a generalized block diagram illustrating one embodiment of a series of timing paths using flip-flop circuits.

While the invention is susceptible to various modifications and alternative forms, specific embodiments are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the spirit and scope of the present invention as defined by the appended claims.

DETAILED DESCRIPTION

In the following description, numerous specific details are set forth to provide a thorough understanding of the present invention. However, one having ordinary skill in the art should recognize that the invention may be practiced without these specific details. In some instances, well-known circuits, structures, and techniques have not been shown in detail to avoid obscuring the present invention.

Referring to FIG. 1 one embodiment of a series of timing paths 100 using flip-flop circuits is shown. This embodiment does not include all examples of timing paths such as replacing a flip-flop circuit with a single latch circuit, replacing combinatorial logic with dynamic logic, or replacing logic with a memory such as a random access memory (RAM) cell or a register file circuit. The embodiment shown is for a simple illustrative purpose.

Flip-flop circuits 130a-130c may use a master-slave latch configuration. Flip-flop circuits 130a-130c may also include single or double output lines, and one of many embodiments for feedback circuits and scan circuitry. As used herein, elements referred to by a reference numeral followed by a letter may be collectively referred to by the numeral alone. For example, flip-flop circuits 130a-130c may be collectively referred to as flip-flop circuits 130. A data input signal is received by line Datain 102. In this embodiment, flip-flops 130a and 130c receive a same clock signal, ClkA, on line 104.

A first timing path exists between the output of flip-flop 130a and the input of flip-flop 130b. Combinatorial logic, Logic 120a, receives the output of flip-flop 130a, performs combinatorial computations dependent on the output of flip-flop 130a, and conveys an output value to the input of flip-flop 130b. A second timing path including logic 120b exists between flip-flops 130b-130c.

Figure 2:
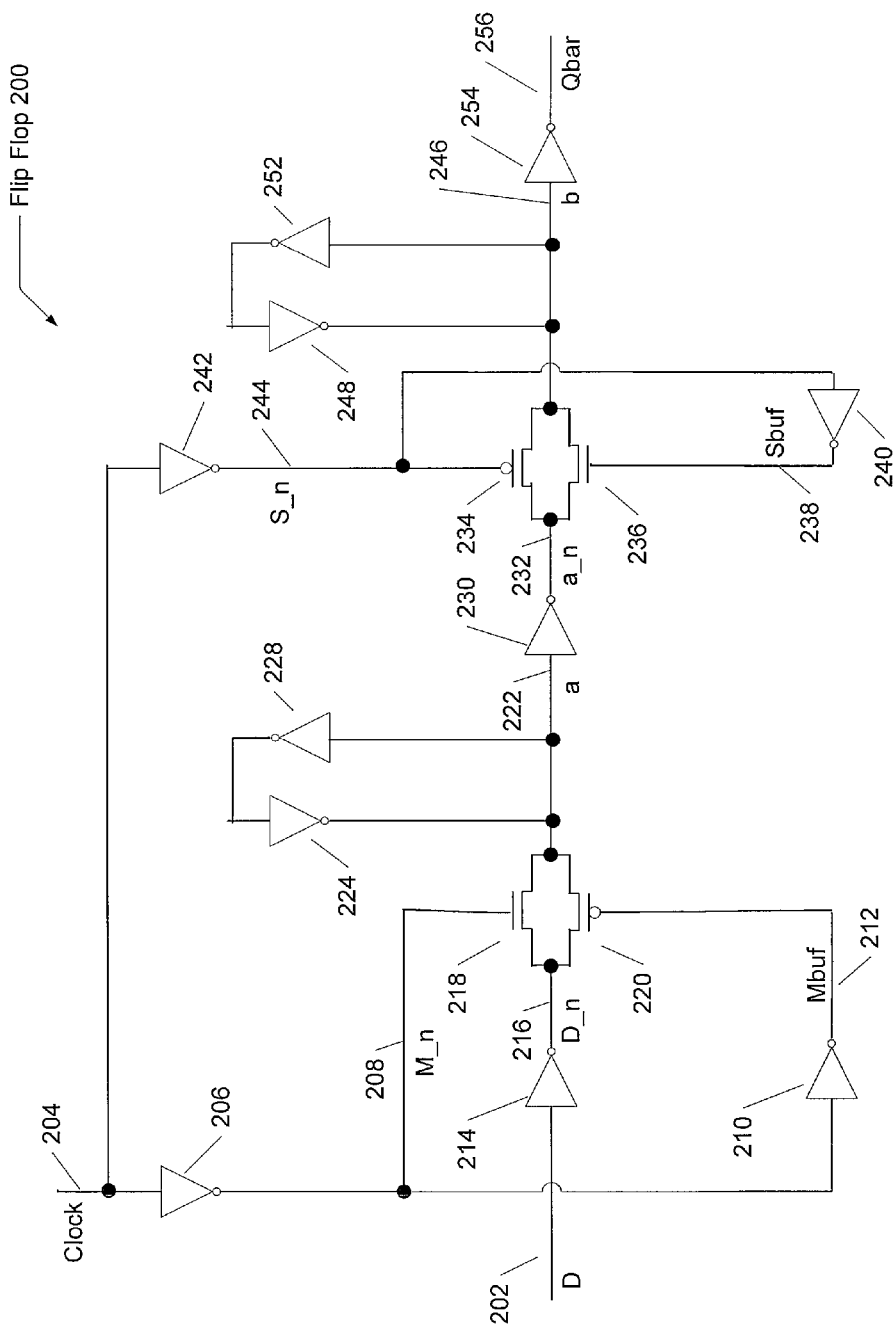
FIG. 2 is a generalized diagram illustrating one embodiment of a flip-flop circuit.

FIG. 2 illustrates one embodiment of a flip-flop circuit 200. This particular embodiment is a positive-edge triggered flip-flop comprising pass-gates, or transmission gates, to implement a master latch and a slave latch. One skilled in the art knows other embodiments may include a negative-edge triggered design, and the master-slave configuration may be implemented with other transistor topologies such as sense amps, C2MOS topology, dynamic circuits, differential inputs, and other design choices. Output data from combinatorial logic, dynamic logic, sequential elements such as latches, other flip-flop circuits, or other is received by the data input line Din 202. A clock signal is received by input clock line 204. A transition of the clock signal (i.e. changing from a logic low value to a logic high value in the positive-edge triggered example) initiates logic value state changes within the flip-flop circuit 200. A logic high value may be equivalent to the value of a power reference and a logic low value may be equivalent to the value of a ground reference. Inverters 206 and 242 provide inverted values of the received clock signal on lines 208 and 244, respectively. Inverters 210 and 240 provide non-inverted values of the received clock signal on lines 212 and 238, respectively. Also, it is possible to use only two inverters, rather than four inverters, to supply the appropriate value of the clock signal to the master and slave latches. However, the use of four inverters may be used to reduce the capacitive loading on the clock line 204. For example, inverters 206 and 242 may isolate the internal nodes of the flip-flop from the clock line 204, which may aid in reducing the sizing of clock buffers higher up in the clock distribution system. Also, inverters 206, 210, 242, and 240 provide unconditional buffered clock signals, since the output clock signals from these inverters do not depend on any other signals or logic.

In this embodiment, a master latch may be implemented by devices 214, 218, and 220. Inverter 214 provides an inverted value, Din_n 216, of the value on line Din 202 to a transmission gate implemented by transistors 218 and 220. A slave latch is implemented by devices 230, 234, and 236. Inverter 230 provides an inverted value, a_n 232, of the output value, a 222, of the master latch transmission gate. The slave latch transmission gate is implemented by transistors 234 and 236. An inverter 254 buffers the output of the slave latch, b 246, and provides the output of the flip-flop circuit, Qbar 256. Node b 246 is the prebuffered data output of the flip-flop 200. Also node b 246 is the internal stored state of flip-flop 200. Output inverter 254 also isolates the output capacitance of the flip-flop circuit from the slave latch transmission gate.

The master latch and slave latch receive inverted clock signals respective of one another. In the positive-edge triggered embodiment shown, the clock lines 208 and 212 are coupled to the transmission gates in a manner to provide the respective inverted clocking. When the received clock signal on line 204 has a logic low value, the master latch is transparent and transmits values from the data input line 202 to node 222. At the same time, the slave latch is opaque and no data transmission from node 232 to node 246 occurs. When the clock signal on line 204 transitions from a logic low value to a logic high value, the reverse scenario occurs and the master latch is opaque and the slave latch is transparent.

In this manner, the output node 256 is dependent on the data input line 202 and the clock signal on line 204. In one embodiment, inverters 224, 228, 248, and 252 are used as feedback circuits on the output nodes of the transmission gates. Without the feedback circuits, when the transmission gates are opaque, there is no driver to ensure their output values are not lost. In the embodiment shown the output value on node 256 is an inverted value of the data input line 202 when the master latch becomes opaque. In alternative embodiments, a separate output may be included in circuit 200 to convey a non-inverted value. Also, in alternative embodiments, modern designs may have one of many embodiments of scan circuitry included in the flip-flop circuit 200 for testing purposes. For simplicity, a scan circuit is not shown.

Figure 3A:
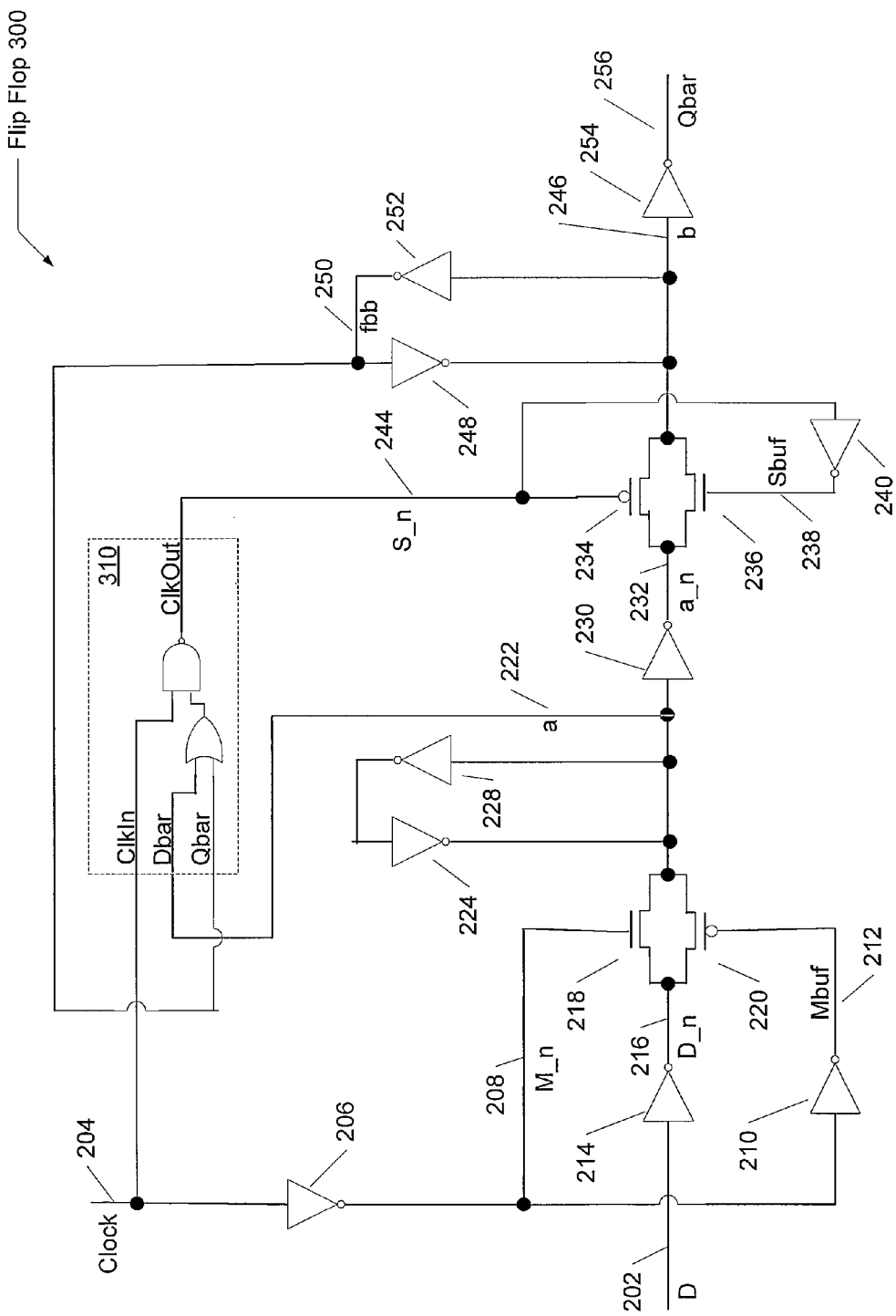
FIG. 3A is a generalized diagram illustrating one embodiment of a flip-flop circuit with a simplified conditional technique for reducing power consumption.

FIG. 3A illustrates one embodiment of a flip-flop circuit 300 with a simplified conditional technique for reducing power consumption. Circuit 300 is generally the same flip-flop as shown in FIG. 2 except for the replacement of inverter 242 with an OR-AND-Inverter (OAI) gate 310. One input to the OAI gate 310 is the received ungated clock signal on line 204. A second input is an inverted value of the stored state of the flip-flop, or an inverted value of the output of the slave latch transmission gate, node fbb 250. The third input is the output of the master latch transmission gate, node a 222, or the inverted value of the input data, D 202.

The OAI gate 310 conditionally disables the received ungated clock input 204 and provides a gated clock input signal S_n 244 to the slave transmission gate. When the stored state of the flip-flop, node fbb 250, and the data input, node a 222, have a same logic low value, the slave latch clock lines 244 and 238 continue to keep the slave transmission gate opaque. Any toggling of the received clock line 204 is not able to turn on the slave latch transmission gate.

In the embodiment shown, the inputs to the OAI gate 310 are arranged with the earliest arriving signal routed the farthest away from the output node S_n 242. This technique allows intermediate nodes of gate 310 to charge or discharge before the latest arriving signal does arrive. Therefore, the propagation delay of gate 310 is reduced. Here, the earliest arriving signal is the stored state of the flip-flop, fbb 250. Its value is set when a new value is stored in the flip-flop upon the rise of the received clock 204. Therefore, signal fbb 250 is routed the farthest away from the output node.

The middle input of gate 310 is node a 222. A value arrives on this node when computations performed by logic between flip-flops have completed during the clock cycle and meet the flip-flop setup time requirement. Finally, the rising edge of the received clock signal 204 arrives last and it is routed to the nearest input of gate 310 to the output of gate 310 as shown in FIG. 3A.

Gate 310 may take advantage of the fact that a flip-flop stored state does not change often, such as less than 2% of the time, and that the majority of flip-flops store a state of a logic low value. Therefore, if a flip-flop is not going to change state, or nodes 222 and 250 have the same value prior to the arrival of the received clock signal 204, then there is no need to supply a clock signal to the slave latch. Further, a full comparison, implemented by an XOR gate, of the values of the nodes 222 and 250 is not needed if the majority of the time node 250 has a logic low value. Then gate 310 may be used in place of a full XOR gate. Gate 310 requires less transistors and has a smaller delay penalty than a full XOR gate. Circuit designers, both custom designers and synthesis designers, may aid the reduction of power consumption by designing logic to provide inputs to flip-flop circuits, such as flip-flop 300, that place a logic low value on internal nodes 222 and 250.

Figure 3B:
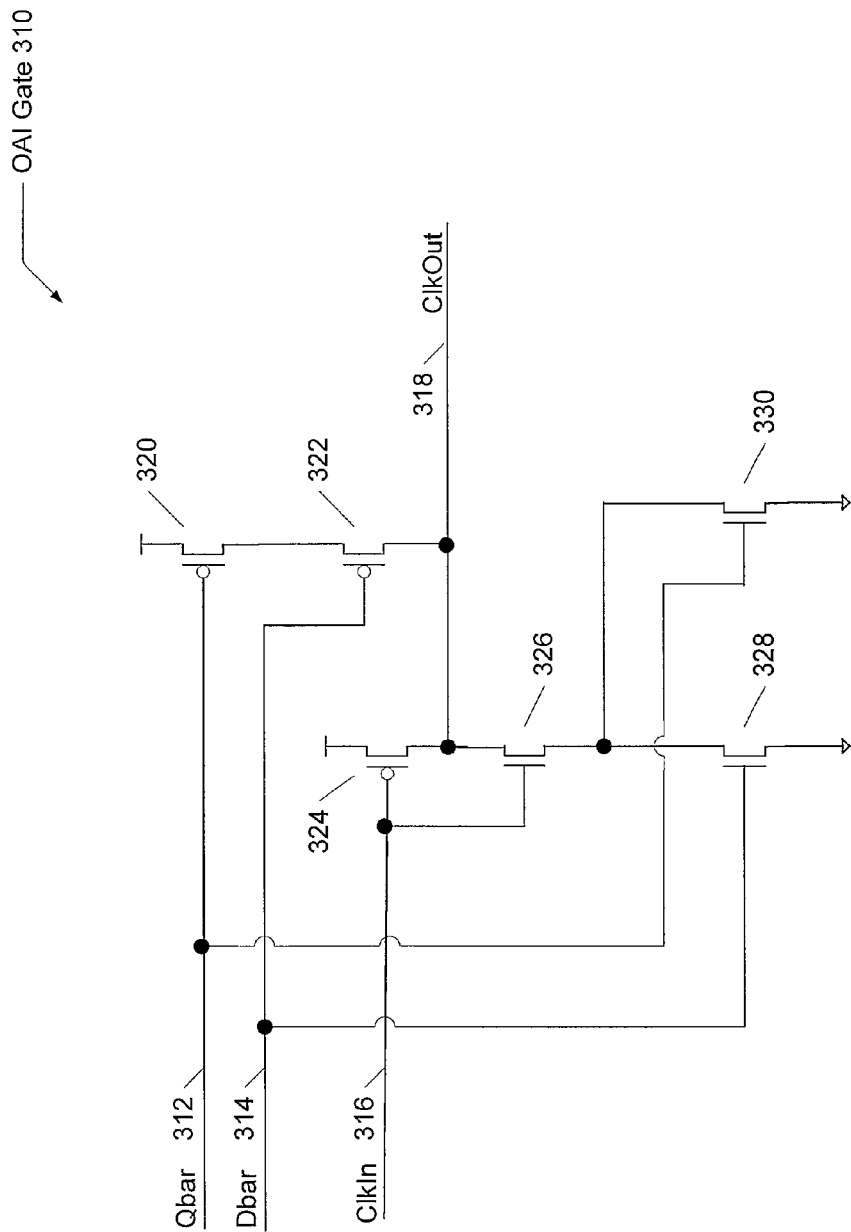
FIG. 3B is a generalized diagram illustrating one embodiment of an OR-AND-Invert (OAI) gate used for power reduction within a flip-flop circuit.

FIG. 3B illustrates one embodiment of the OAI gate 310 used for power reduction within a flip-flop circuit. Inputs 312, 314, and 316 are arranged with the earliest arriving signal routed the farthest away from the output node ClkOut 318 as described above. The n-type metal oxide semiconductor (NMOS) transistors 326, 328, and 330 provide the logic function of OAI gate 310. The p-type metal oxide semiconductor (PMOS) transistors 320, 322, and 324 provide the complementary function of the NMOS transistors. It can be seen in this embodiment that the setup time of the flip-flop circuit increases since the input on the data line of the flip-flop needs to reach transistors 322 and 328 prior to the arrival of the rising edge of the received clock on line 316. Referring to FIG. 3A, the data input already had to traverse inverter 216 and the master transmission gate implemented by transistors 218 and 220 before the arrival of a rising edge of the received clock on line 204. Also, in FIG. 3B the new data value must propagate through one more transistor delay in gate 310 (i.e. transistor 322 or 328 depending on the new data value). However, this may be a small delay penalty for a significant reduction in power consumption. Further, the OAI gate 310 has a total of six transistors, or only four more transistors than the previously placed inverter (i.e. inverter 242 in FIG. 2). The additional area penalty is small for a significant reduction in power consumption.

This embodiment and other embodiments of a logic gate to conditionally gate the clock to a slave latch of a flip-flop circuit may also be used in single latch designs. For example, latches that provide input data to dynamic or domino logic may use clock gating by use of OAI gate 310 and be designed to hold a logic low value on the output. Therefore, unless a state change does occur, the NMOS stacks of the dynamic logic maintain a logic low value on their gate inputs and they do not discharge the dynamic node or fight with the keeper circuitry.

Figure 4:
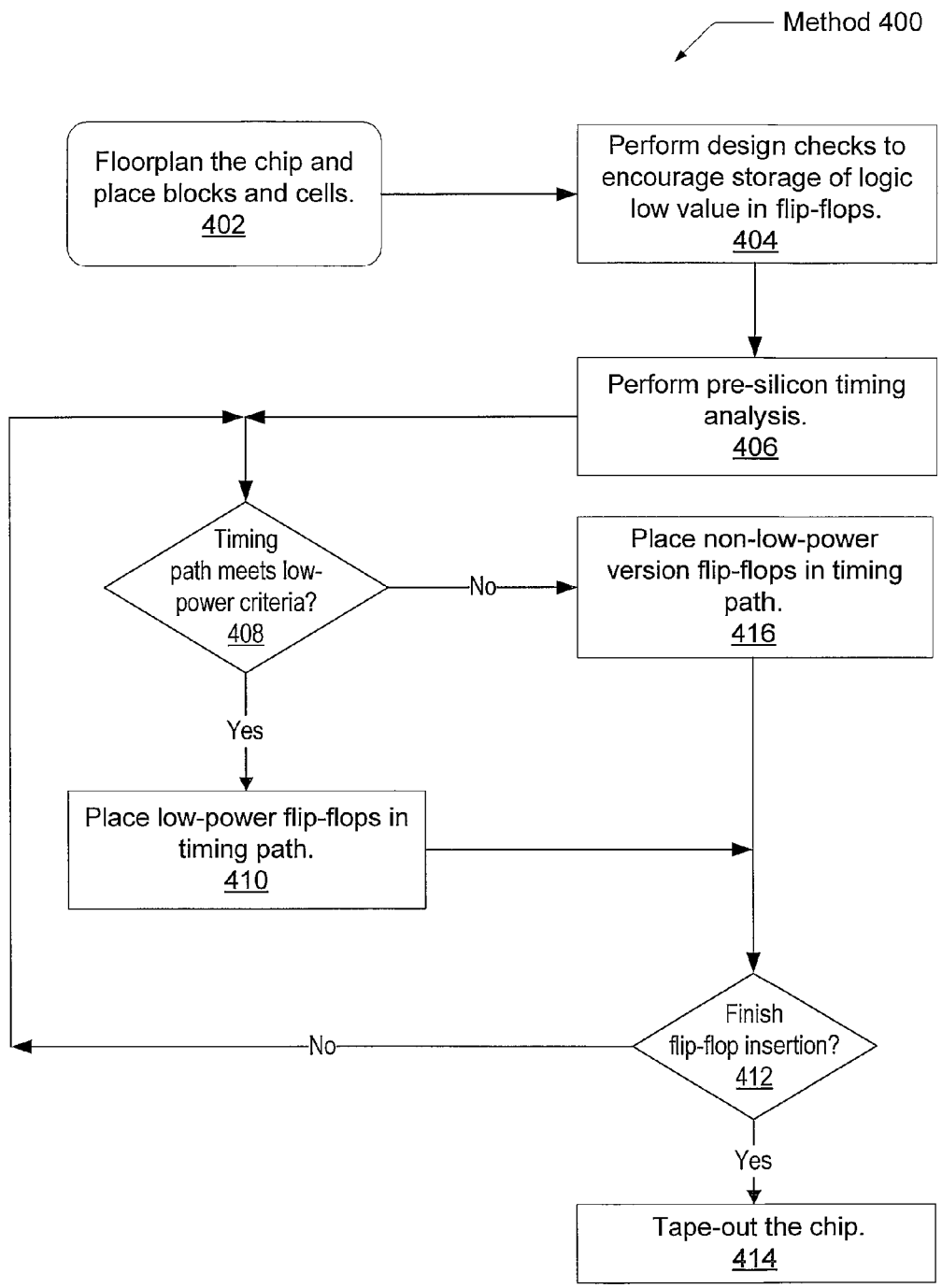
FIG. 4 is a general block diagram illustrating one embodiment of a method for reducing power consumption within a flip-flop circuit on a semiconductor chip.

FIG. 4 illustrates a method 400 for reducing power consumption within a flip-flop circuit on a semiconductor chip. Method 400 may be modified by those skilled in the art in order to derive alternative embodiments. Also, the steps in this embodiment are shown in sequential order. However, some steps may occur in a different order than shown, some steps may be performed concurrently, some steps may be combined with other steps, and some steps may be absent in another embodiment. In the embodiment shown, a semiconductor chip is floorplanned and individual blocks and cells are placed according to the floorplan in block 402.

In block 404, architectural logic is verified and design checks are performed. Some of these design checks may be used to ensure circuits meet noise thresholds, migration current thresholds, and other predetermined criteria. Another design check may be utilized to encourage storage of a logic low value in flip-flops. Custom circuit designers and synthesis designers, such as programmers using register transfer language (RTL) synthesis tools, may design their cells and blocks to place a logic low value both on the input and the output of the slave latch of flip-flop circuits. In this manner, the slave transmission gate is opaque the majority of the time and internal switching of flip-flop nodes is decreased. Therefore, power consumption reduces.

Pre-silicon timing analysis is performed in block 406. Timing paths and circuits are redesigned and transistors are resized in order to meet the target clock cycle for the chip design. If a timing path meets lower power criteria, such as its delay is smaller than the clock cycle time by a predetermined timing threshold (block 408), then the low-power flip-flop utilizing OAI gate 310 may be inserted in the timing path in block 410. If the timing path does not meet the predetermined threshold (block 408), then the low-power flip-flop may cause timing problems for post-silicon timing paths. Another flip-flop version may be chosen to be inserted in the timing path in block 416.

If all timing paths have been inspected and the appropriate flip-flop circuit has been inserted in the timing paths (block 412), then the chip is ready for tape-out as long as all other design requirements not affecting flip-flop insertion have been satisfied also in block 414. If all timing paths have not yet been inspected (block 412), control flow returns to conditional block 408.

Figure 5:
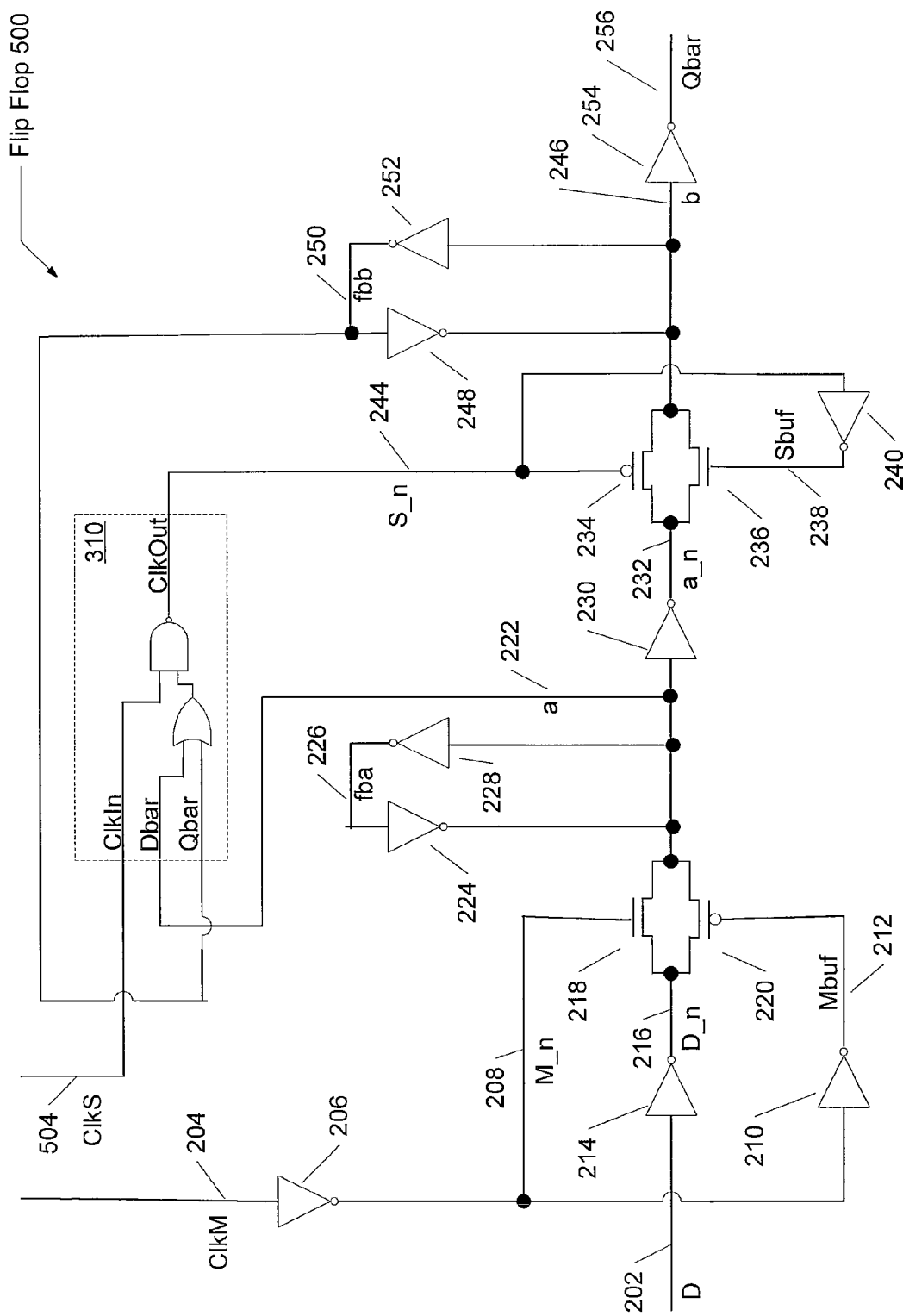
FIG. 5 is a generalized diagram illustrating one embodiment of a flip-flop circuit with split clocks.

Referring to FIG. 5, one embodiment of a flip-flop circuit 500 with split clocks is shown. The flip-flop circuit 300 is provided, but with an additional clock signal, a separate slave clock signal, provided on line 504. This additional clock signal along with nodes 222 and 250 determines when the slave transmission gate is transparent or opaque. The master clock signal may have the same duty cycle as the slave clock signal and be in phase with the slave clock signal, but a delay may exist between the rising and falling edges of the slave clock signal and the respective edges of the master clock signal. A design with the split clocks and a delayed master clock signal may be used to shift the rising edge of the master clock, which is used to define the setup time of the flip-flop. This shifting allows a timing path prior to the flip-flop to have more time for logic computations without increasing the clock cycle. Timing waveforms that display this shifting and increase in computation time is described later.

Figure 6:
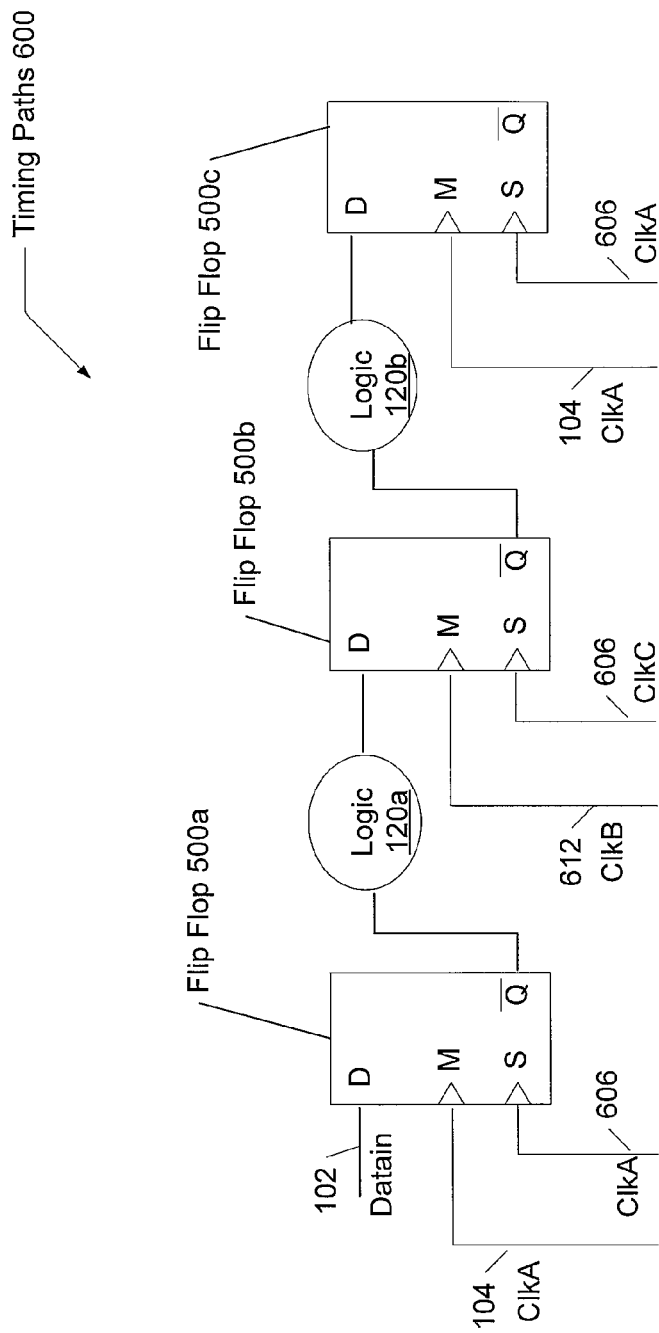
FIG. 6 is a generalized diagram illustrating one embodiment of a series of timing paths using flip-flop circuits with split clocks.

FIG. 6 illustrates one embodiment of a series of timing paths 600 using flip-flop circuits with split clocks. This embodiment as with the embodiment shown in FIG. 1 does not include all examples of timing paths, but shows one example for a simple illustrative purpose.

Flip-flop circuits 500 may use a master-slave latch configuration. Flip-flop circuits 500 may also include single or double output lines, and one of many embodiments for feedback circuits and scan circuitry. A data input signal is received by line Datain 102. In this embodiment, flip-flops 500a and 500c receive a same master clock signal, ClkA, on line 104. Flip-flop circuit 500b receives a master clock signal, ClkB, on line 612. Each flip-flop 500 receives a slave clock signal ClkC on line 606. A description of these clock waveforms is described next.

Figure 7:
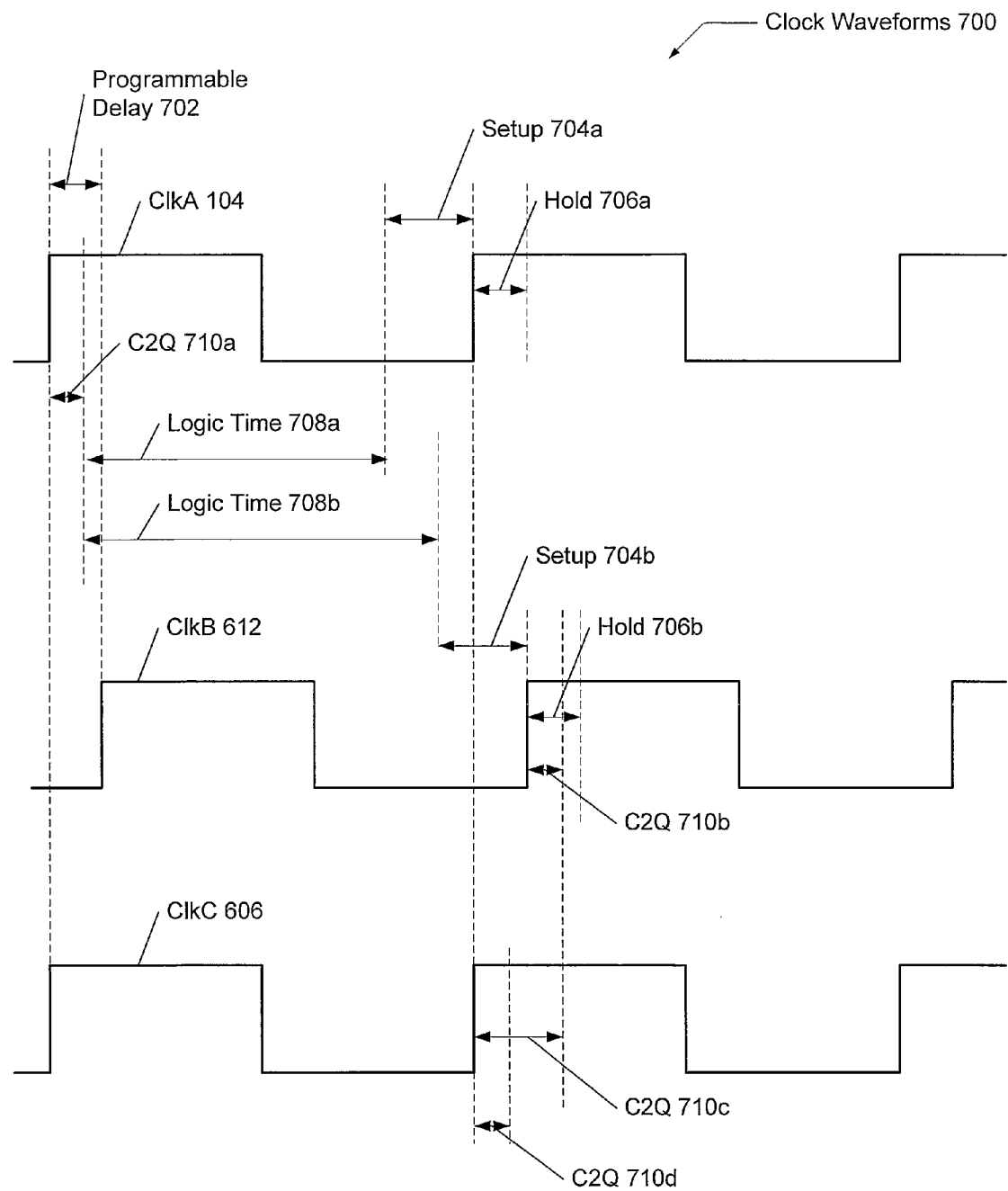
FIG. 7 is a generalized diagram illustrating one embodiment of clock waveforms used for the timing requirements of timing paths using flip-flop circuits with split clocks.

FIG. 7 illustrates one embodiment of the clock waveforms 700 used for the timing requirements of timing paths shown in FIG. 6. As can be seen here, master clock waveform ClkB 612 has a same duty cycle as master clock waveform ClkA 104, but is delayed from ClkA 104 by a programmable delay value 702. In one embodiment, this delay may be implemented by clock delay circuits within the clock distribution system and delay 702 may be set in post-silicon in order to ease fixing timing paths in post-silicon. In one embodiment, the Programmable Delay 702, may be implemented in post-silicon, or after the semiconductor chip is fabricated and returned for testing. Failing timing paths, such as the timing path with Logic 220a, may be fixed in post-silicon by changing the clock signal supplied to flip-flop 230b from ClkA 104 to ClkB 612.

Slave clock waveform ClkC 606 is shown to have the same duty cycle as master clock waveform ClkA 104 with no delay. In alternative embodiments, a non-zero delay may exist between master clock ClkA 104 and slave clock ClkC 606 and this delay value may be different from the value of the programmable delay 702.

Flip-flop 500a may have a clock-to-Q value, C2Q 710a, which represents the delay between the time the clock signal rises and the output of flip-flop 500a is present on its output line. Flip-flop 500a may have a setup time of Setup 704a that requires the input signal on its input line to remain stable for a minimum duration prior to the rise of the master clock signal. This duration may be defined by the delay of the inverter supplying the inverted input data value to the master transmission gate and the delay of the master transmission-gate. Further, the delay is extended by a transistor delay by OAI gate 310. If the data input signal is not stable for the setup duration prior to the clock rising, then the input data value may not have time to be stored by the master latch.

Also, flip-flop 500a may have a hold time value of Hold 706a that requires the input signal on its input line to remain stable for a minimum duration subsequent the rise of the clock signal. This duration may be defined by the delay of the inverter supplying the inverted input data value to the master transmission gate and the delay of the master transmission gate. If the data input signal is not stable for the hold duration subsequent to the clock rising, then the input data value may have time to over-write the required value to be stored by the master latch.

Flip-flop 500b may have a setup time, Setup 704b. Due to the programmable delay 702 that delays the clock edge transitions of master clock waveform ClkB 612 with respect to master clock waveform ClkA 104, Logic 220a has more time for computations represented by Logic Time 708b. If flip-flop 500b received master clock ClkA 104 instead, then Logic 220a only has time for computations represented by Logic Time 708a, which is smaller. Since the duty cycles of ClkA 104 and ClkB 612 are the same, the frequency of the design did not change, but more time was given to Logic 220a to perform computations by the use of master clock Clk B 612 provided to flip-flop 500b.

Because the slave clock Clk C 606 provided to flip-flop 500b is not delayed as its master clock Clk B 612, this implementation does not increase the perceived C2Q value of the subsequent timing path. Therefore, the C2Q delay of flip-flop 500b is shown as C2Q 710d. If flip-flop 500b did not have split clocks, but only received a single clock, and its slave clock was delayed the same amount as the master clock, then the C2Q delay of flip-flop 500b, C2Q 710b, would be delayed and provide the perceived delay value of C2Q 710c. However, this is not the case as flip-flop 500b has a separate slave clock, ClkC 606, which is not delayed.

However, the split clocks do provide a design trade-off. The hold time of flip-flop 500b, Hold 706b, is delayed, since its master clock waveform, ClkB 612, is delayed. Therefore, Logic 220a must provide a stable value to the input of flip-flop 500b for a longer duration than required without a delayed master clock. However, this timing requirement may be easily many for many paths.

Figure 8:
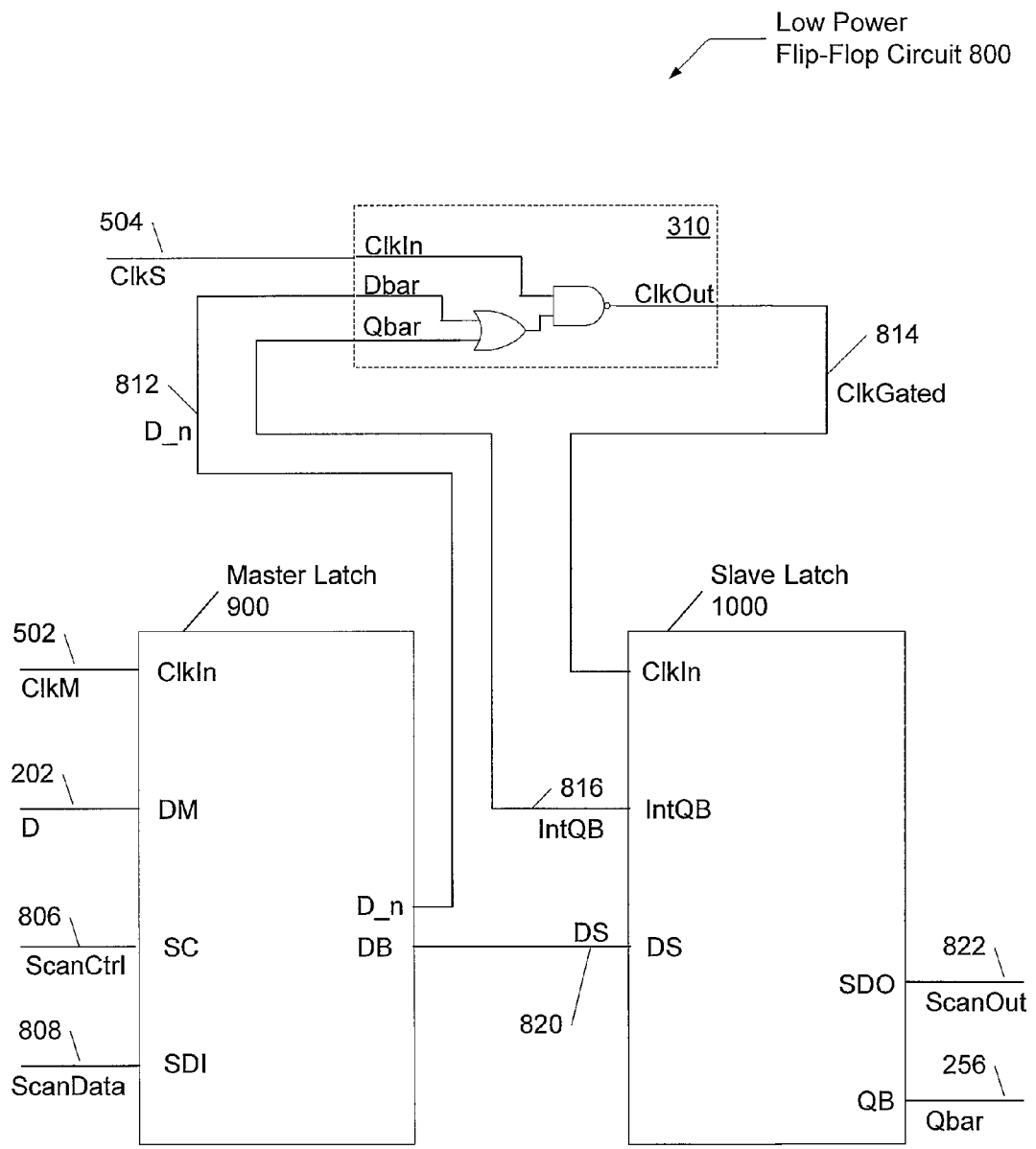
FIG. 8 is a generalized diagram illustrating one embodiment of an alternative embodiment of a low power flip-flop circuit.

Referring to FIG. 8, an alternative embodiment of a low power flip-flop circuit 800 is shown. Flip-flop 800 is similar to flip-flop 500 shown in FIG. 5, but the master latch and slave latch include different feedback circuits and include scan test circuitry, which will be shown shortly.

A data input signal is provided on line 202 as before. A master clock signal and a separate slave clock signal are provided on lines 502 and 504, respectively, as described above. One input to the OAI gate 310 is the received separate slave clock signal on line 504. A second input is an inverted value of the stored state of the flip-flop, or an inverted value of the output of the slave transmission gate within slave latch 1000. This value is routed on line IntQB 816. The third input is the output of the master transmission gate within master latch 900. This value is routed on line D_n 812.

Again, the OAI gate 310 conditionally disables the received slave clock input 504. When the values on the lines 812 and 816 have a same logic low value, the gated clock signal ClkGated 814 continues to keep the slave transmission gate opaque within slave latch 1000. Any toggling of the received separate slave clock line 504 is not able to turn on the slave transmission gate.

The output of the master transmission gate is routed to the input of the slave transmission gate on line DS 820. A scan test control signal, ScanCtrl 806, and a scan test data signal, ScanData 808, are provided to the master latch 900. A scan output signal, ScanOut 822, and the flip-flop data output signal, Qbar 256, are conveyed by the slave latch 1000.

Figure 9:
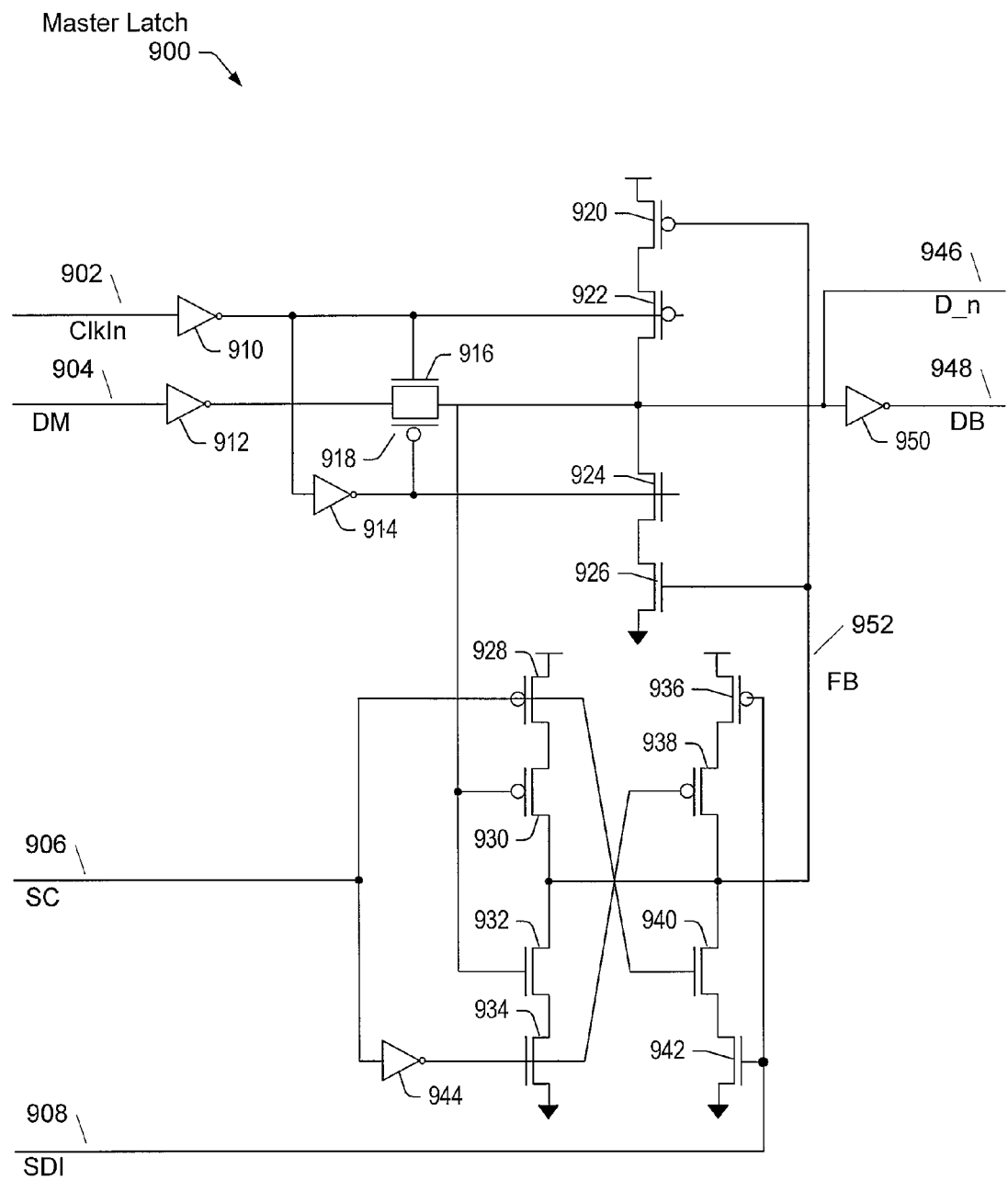
FIG. 9 is a generalized diagram illustrating one embodiment of an alternative embodiment of a master latch.

FIG. 9 illustrates an alternative embodiment of a master latch with circuit 900. Inverter 912 provides an inverted value of the received data input value on line DM 904 to a master transmission gate implemented by transistors 916 and 918. Inverter 910 provides an inverted value of the received input clock signal on line 902. Inverter 914 provides a buffered non-inverted value of the received input clock signal on line 902. Inverter 950 buffers the output of the master transmission gate and conveys the output DB 948 to an outside slave latch. The output of the master transmission gate, D_n 946, is routed out of the master latch and to the outside OAI gate 310.

When the received clock signal on line 902 has a high logic value and causes the master transmission gate to become opaque, the node D_n 946 needs a driver to maintain the value latched by the master latch 900. During operation, the scan test inputs, SC 906 and SDI 908, are each set to a logic low value. Therefore, transistors 938 and 942 are turned off and do not conduct. Therefore, the set of transistors 936-942 do not drive the feedback node FB 952.

The set of transistors 928-934 has at least one conduction path to a power reference or to a ground reference and, therefore, this set does drive the feedback node FB 952. An inverted value of the node D_n 946 is driven onto node FB 952 by this set of transistors. The set of transistors 920-926 has at least one conduction path to a power reference or to a ground reference and this set drives a non-inverted value of the node D_n 946 back onto this same node and completes the feedback network.

During testing, the received scan test control signal SC 906 is asserted to a logic high value. The set of transistors 928-934 now do not have a conducting path to a power reference or a ground reference and this set does not drive the node FB 952. Now the set of transistors 936-942 has at least one conducting path to a power reference or a ground reference dependent upon the received scan test data input SDI 908. An inverted value of the input SDI 908 is driven onto node FB 952. Again, the received clock signal on line 902 has a high logic value and causes the master transmission gate to become opaque. The set of transistors 920-926 has at least one conducting path to a power reference or a ground reference dependent upon the node FB 952. An inverted value of node FB 952 is driven onto node D_n 946. This value is the same as the received input SDI 908.

Figure 10:
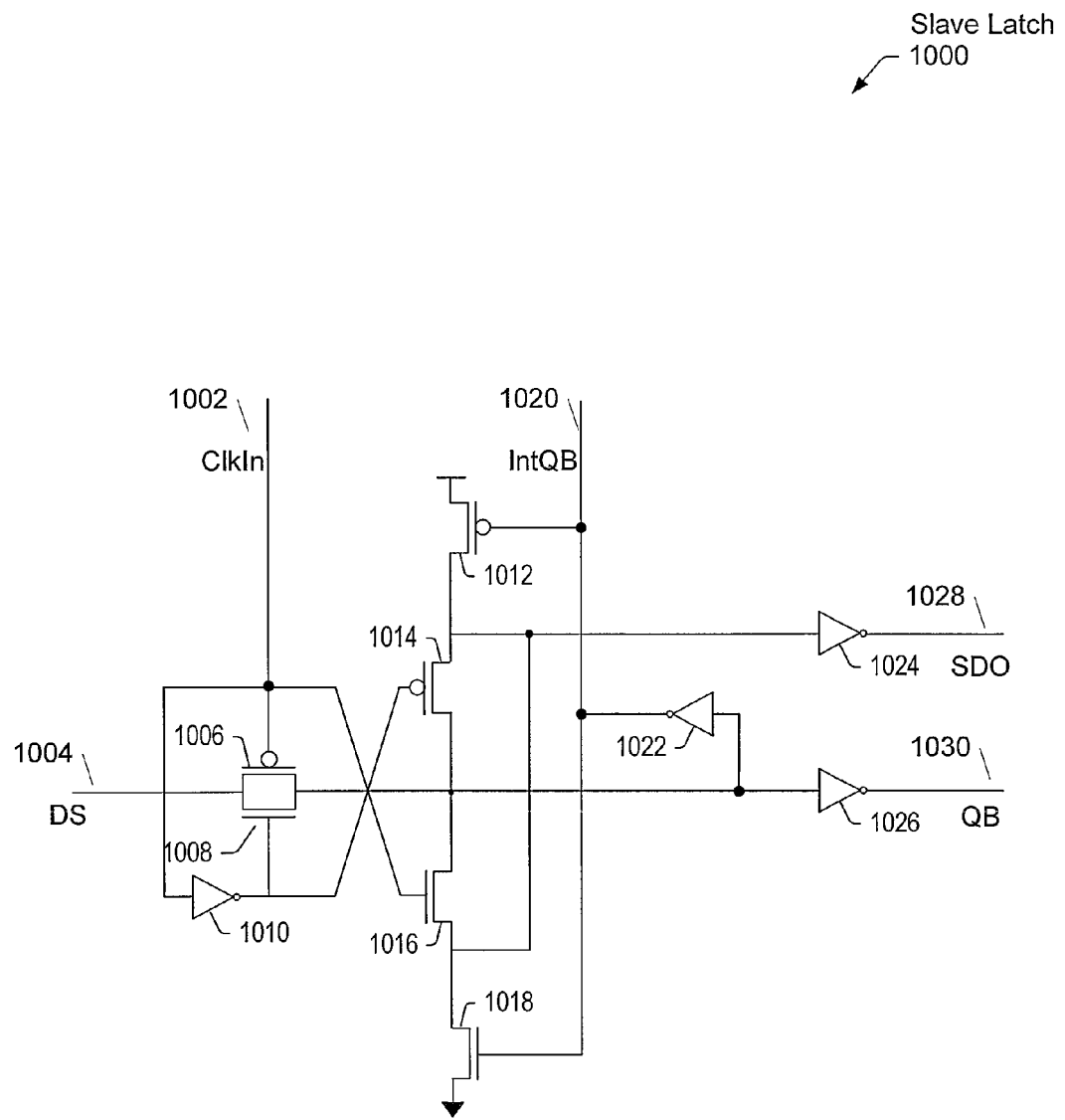
FIG. 10 is a generalized diagram illustrating one embodiment of an alternative embodiment of a slave latch.

FIG. 10 illustrates an alternative embodiment of a slave latch with circuit 1000. The output data of a master latch, whether it is during normal operation or during testing, is received on line DS 1004, which is provided to a slave transmission gate implemented by transistors 1006 and 1008. The gated clock output of the OAI gate 310 is received on line 1002. Inverter 1010 provides an inverted value of the received input clock signal to the slave transmission gate. Both the non-inverted and inverted values of the received clock signal on line 1002 are provided to the set of transistors 1012-1018 used as a feedback network.

A transparent slave transmission gate provides the received data input DS 1004 to inverters 1022 and 1026. Inverter 1026 buffers this value and provides an inverted value as the output of the slave latch on line QB 1030. Inverter 1022 provides the same logic value as QB 1030 to the feedback network implemented by the set of transistors 1012-1018 and to the output node IntQB 1020, which is received by the outside OAI gate 310.

When the slave transmission gate is opaque, transistors 1014 and 1016 are on and may conduct. The logic value of the node IntQB 1020 determines if the set of transistors 1012-1018 has a conducting path to a ground reference or to a power reference. Therefore, the output of the slave transmission gate is still driven. The input of inverter 1024 has an inverted logic value of the node IntQB 1020. Inverter 1024 provides the output value SDO 1028, which is the same logic value as the output value QB 1030.

Although the embodiments above have been described in considerable detail, numerous variations and modifications will become apparent to those skilled in the art once the above disclosure is fully appreciated. It is intended that the following claims be interpreted to embrace all such variations and modifications

What is claimed is:

1. A flip-flop circuit comprising:
a master latch configured to:
receive an input data signal; and
receive a first clock signal;
a slave latch coupled to the master latch, wherein the slave latch is configured to:
receive a gated clock signal derived from a second clock signal different from the first clock signal; and
store a data output state;
a clock gating circuit;
wherein in response to detecting the second clock signal has a logic value configured to enable transmission of data through the slave latch, the clock gating circuit is configured to:
disable the gated clock signal responsive to detecting the input data signal and the data output state have a same first logic value; and
enable the gated clock signal responsive to detecting the input data signal and the data output state have a same second logic value different from the first logic value.

2. The flip-flop circuit as recited in claim 1, wherein the clock gating circuit does not utilize a delayed version of the second clock signal.

3. The flip-flop circuit as recited in claim 2, wherein the second clock signal is not coupled to an output gate terminal of an output transistor that has an output drain terminal coupled to a prebuffered data output.

4. The flip-flop circuit as recited in claim 1, wherein the first clock signal transitions after the second clock signal transitions by a predetermined delay.

5. The flip-flop circuit as recited in claim 4, wherein the clock gating circuit is a complex gate with transistors that are separate from the master latch and the slave latch.

6. The flip-flop circuit as recited in claim 1, wherein the clock gating circuit comprises:
a first set of three transistors; and
a second set of three transistors;
wherein the first set of transistors comprises:
a first transistor having a first drain terminal coupled to the the gated clock signal, a first gate terminal coupled to the second clock signal, and a first source terminal coupled to an intermediate node;
a second transistor having a second drain terminal coupled to the intermediate node, and a second gate terminal coupled to an inverted value of the input data signal, and a second source terminal coupled to a ground reference; and
a third transistor having a third drain terminal coupled to the intermediate node, a third gate terminal coupled to an inverted value of the prebuffered data output, and a third source terminal coupled to the ground reference.

7. The flip-flop circuit as recited in claim 6, wherein the second set of transistors represents a complementary network with respect to the first set of transistors.

8. The flip-flop circuit as recited in claim 1, wherein the first logic value is a logic low value.

9. The flip-flop circuit as recited in claim 1, wherein the first logic value is a logic high value.

10. The flip-flop circuit as recited in claim 6, wherein the first logic value is a logic low value.

11. A clock gating method in a flip-flop circuit, the method comprising:
receiving in a master latch an input data signal and a first clock signal;

receiving in a slave latch coupled to the master latch a gated clock signal derived from a second clock signal that is different from the first clock signal; and storing in the slave latch a data output state;

wherein in response to detecting the second clock signal has a logic value configured to enable transmission of data through the slave latch, a clock gating circuit:

disabling the gated clock signal responsive to detecting the input data signal and the data output state have a same first logic value; and enabling the gated clock signal responsive to detecting the data input signal and the data output state have a same second logic value different from the first logic value.

12. The clock gating method as recited in claim 11, wherein the clock gating circuit does not utilize a delayed version of the second clock signal.

13. The clock gating method as recited in claim 12, wherein the second clock signal is not coupled to an output gate terminal of an output transistor with an output drain terminal coupled to a prebuffered data output.

14. The clock gating method as recited in claim 11, wherein the first clock signal transitions after the second clock signal transitions by a predetermined delay.

15. The clock gating method as recited in claim 14, wherein the clock gating circuit is a complex gate with transistors separate from the master latch and the slave latch.

16. The clock gating method as recited in claim 11, wherein the clock gating circuit includes no more than two transistors coupled to each of three inputs.

17. The clock gating method as recited in claim 11, further comprising utilizing scan test circuitry in the master latch to store a data value when the first clock signal has a logic value configured to disable transmission of data through the master latch.

18. The clock gating method as recited in claim 16, wherein the first logic value is a logic low value.

19. The clock gating method as recited in claim 11, wherein the first logic value is a logic high value.

20. The clock gating method as recited in claim 11, wherein the first logic value is a logic low value.

* * * * *